United States Patent
Nakazawa et al.

(10) Patent No.: US 7,230,285 B2
(45) Date of Patent: Jun. 12, 2007

(54) SEMICONDUCTOR DEVICE AND HETERO-JUNCTION BIPOLAR TRANSISTOR

(75) Inventors: Satoshi Nakazawa, Osaka (JP); Yutaka Hirose, Kyoto (JP); Tsuyoshi Tanaka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/927,525

(22) Filed: Aug. 27, 2004

(65) Prior Publication Data

US 2005/0121696 A1 Jun. 9, 2005

(30) Foreign Application Priority Data

Sep. 2, 2003 (JP) .............................. 2003-309586

(51) Int. Cl.
*H01L 31/0328* (2006.01)
*H01L 29/06* (2006.01)

(52) U.S. Cl. .......................... 257/197; 257/11; 257/12; 257/183; 257/200

(58) Field of Classification Search ................ 257/183, 257/191, 197–198, 200, 445, 565, 571, 576, 257/586, 11–12; 438/235, 309, 312, 315, 438/342–343, 317
See application file for complete search history.

(56) References Cited

U.S. PATENT DOCUMENTS 5,641,975 A * 6/1997 Agarwal et al. ............... 257/76
6,858,509 B2 * 2/2005 Delage et al. ............... 438/315
2002/0195619 A1 * 12/2002 Makimoto et al. .......... 257/197

FOREIGN PATENT DOCUMENTS

JP 2002-305204 A 10/2002

OTHER PUBLICATIONS

O. Ambacher et al., "Two-dimensional electron gases induced by spontaneous and piezoelectric polarization charges in N- and Ga-face AlGaN/GaN heterostructures", J. of Applied Physics, vol. 85, No. 6, pp. 3222-3233, Mar. 15, 1999.*

* cited by examiner

*Primary Examiner*—Ori Nadav
(74) *Attorney, Agent, or Firm*—McDermott Will & Emery LLP

(57) ABSTRACT

In an npn-type HBT, each of an emitter layer and a collector layer is formed of AlGaN and a base layer is formed of GaN. The emitter layer is in contact with a nitrogen polarity surface of the base layer and the collector layer is in contact with a gallium polarity surface of the base layer. An electric charge is generated at each interface due to a spontaneous polarization and a piezo polarization generated in each of the layers. Because of the electric charge, an internal field is generated so as to accelerate electrons in the base layer.

1 Claim, 9 Drawing Sheets

SEMICONDUCTOR DEVICE AND HETERO-JUNCTION BIPOLAR TRANSISTOR

CROSS-REFERENCE TO RELATED APPLICATION

This application claims priority under 35 U.S.C. §119(a) on Japanese Patent Application No. 2003-309586 filed on Sep. 2, 2003, the entire contents of which are hereby incorporated by reference.

BACKGROUND OF THE INVENTION

1. Technical Field to which the Invention Belongs

The present invention relates to a semiconductor device and a hetero-junction bipolar transistor in which an n-type first semiconductor layer, a p-type second semiconductor layer and an n-type third semiconductor layer are in contact with one another in this order, and more particularly relates to measures for improving high-frequency characteristics.

2. Prior Art

Conventionally, nitride semiconductor has been well known. The known nitride semiconductor is a semiconductor which has a wide band gap and a high breakdown electric field and therefore its high output operation has been expected. As semiconductor devices using this nitride semiconductor, high electron mobility transistors (HEMTs) and hetero-junction bipolar transistors (HBTs) have been proposed. As an HBT of this kind, in Japanese Laid-Open Publication No. 2002-305204, an npn-type device including a p-type layer of nitride semiconductor is disclosed. In an HBT disclosed in Japanese Laid-Open Publication No. 2002-305204, as shown in FIG. 9, a GaN buffer layer 3, a subcollector layer 7, a collector layer 6, an InGaN buffer layer 15, a base layer 5 and an emitter layer 4 are stacked on a sapphire substrate 1 in this order. Of the layers, the subcollector layer 7 and the collector layer 6 are formed of n-type gallium nitride (GaN), the base layer 5 is formed of p-type indium gallium nitride (InGaN), and the emitter layer 4 is formed of n-type GaN. In the HBT, each of the layers is formed by metal organic chemical vapor deposition (MOCVD). Then, electrodes 8 are formed on respective upper surfaces of the subcollector layer 7, the base layer 5 and the emitter layer 4, respectively.

SUMMARY OF THE INVENTION

By the way, in the known HBT disclosed in Japanese Laid-Open Publication No. 2002-305204, the base layer 5 is formed of a ternary system, i.e., InGaN, so that a spontaneous polarization is generated in the base layer 5. Moreover, with the GaN buffer layer 3 and the InGaN buffer layer 15 provided, strains to be generated in the base layer 5 are suppressed. However, it is not possible to completely inhibit the generation of strains and therefore a piezo polarization is generated. In the HBT, as shown in FIG. 10, since each of the layers are formed by MOCVD, an internal electric field is generated in the base layer 5 so that as electrons 13 move from the emitter layer 4 to the collector layer 6, the energy of the electrons 13 is increased. Thus, in the base layer 5, the internal electric field is generated in the direction in which the movement of the electrons 13 as carriers are hindered and the base transit time of the electrons 13 is increased, so that high-frequency characteristics are deteriorated. Moreover, due to the internal electric field, holes 14, i.e., majority carriers existing in the base layer 5 move away from an electrode 8 and are concentrated in a lower portion (the collector side) of the base layer 5, so that the problem of increase in base resistance is caused.

Furthermore, in the HBT disclosed in Japanese Laid-Open Publication No. 2002-305204, the composition ratio of the base layer 5 is gradually changed in the film thickness direction. Thus, not only a fabrication method becomes complicated but also it is difficult, in view of crystallinity, to fabricate a quality HBT.

The present invention has been devised in view of the above-described points and it is therefore an object of the present invention to improve high-frequency characteristics and reduce the resistance of a p-type semiconductor layer, while avoiding having a fabrication method complicated.

The present invention is directed to the generating a polarization so that an electric field is generated in the direction in which carriers are accelerated in a p-type semiconductor layer.

Specifically, a first aspect of the present invention is assumed to be a semiconductor device including: an n-type first semiconductor layer formed so that electrons are externally injected into the first semiconductor layer; a p-type second semiconductor layer formed so that electrons injected into the first semiconductor layer are injected into the second semiconductor layer; and an n-type third semiconductor layer formed so that electrons having passed through the second semiconductor layer flow into the third semiconductor layer, the first, second and third semiconductor layers being in contact with one another in this order. Spontaneous polarizations Psp1, Psp2 and Psp3 are generated in the first, second and third semiconductor layers, respectively, and the second semiconductor layer is formed so as to have a configuration in which an internal electric field is generated so that an energy of electrons decreases in the direction from the first semiconductor layer to the third semiconductor layer due to an electric charge Q12 generated at an interface with the first semiconductor layer by an interaction of the spontaneous polarizations Psp1 and Psp2 and an electric charge Q23 generated at an interface with the third semiconductor layer by an interaction of the spontaneous polarizations Psp2 and Psp3.

In this structure, in the p-type second semiconductor layer, the internal electric field due to the electric charge Q12 and the electric charge Q23 is generated so that the energy of electrons as carriers decreases along a moving direction. Therefore, the electrons are accelerated by the internal electric field in the direction from the first semiconductor layer to the third semiconductor layer. Therefore, the transit time of electrons injected from the first semiconductor layer and traveling in the second semiconductor layer toward the third semiconductor layer can be reduced, so that high-frequency characteristics can be improved. When the semiconductor device is applied to an HBT, holes are stored in the vicinity of the base electrode due to the internal electric field. Accordingly, a base resistance can be reduced. Furthermore, the internal electric field is generated by actions of the spontaneous polarizations Psp1, Psp2 and Psp3 generated in the semiconductor layers, respectively. Therefore, there is no need to change the composition ratio of the second semiconductor layer in the film thickness direction for the purpose of changing the band structure to reduce a resistance in the second semiconductor layer. As a result, it is possible to prevent a method for fabricating a semiconductor device from becoming complicated and also to stably obtain a quality semiconductor device.

Moreover, a second aspect of the present invention is assumed to be a semiconductor device including: an n-type first semiconductor layer formed so that electrons are externally injected into the first semiconductor layer; a p-type second semiconductor layer formed so that electrons injected into the first semiconductor layer are injected into the second semiconductor layer; and an n-type third semiconductor layer formed so that electrons having passed through the second semiconductor layer flow into the third semiconductor layer, the first, second and third semiconductor layers being in contact with one another in this order. Piezo polarizations Ppz1, Ppz2 and Ppz3 are generated in the first, second and third semiconductor layers, respectively, and the second semiconductor layer is formed so as to have a configuration in which an internal electric field is generated so that an energy of electrons decreases in the direction from the first semiconductor layer to the third semiconductor layer due to an electric charge Q12 generated at an interface with the first semiconductor layer by an interaction of the piezo polarizations Ppz1 and Ppz2 and an electric charge Q23 generated at an interface with the third semiconductor layer by an interaction of the piezo polarizations Ppz2 and Ppz3.

In this structure, in the p-type second semiconductor layer, the internal electric field due to the electric charge Q12 and the electric charge Q23 is generated so that the energy of electrons as carriers decreases along a moving direction. Accordingly, a transit time of electrons injected from the first semiconductor layer and traveling in the second semiconductor layer toward the third semiconductor layer can be reduced, so that high-frequency characteristics can be improved. When the semiconductor device is applied to an HBT, holes are stored in the vicinity of the base electrode due to the internal electric field. Therefore, a base resistance can be reduced. Furthermore, the internal electric field is generated by actions of the piezo polarizations Ppz1, Ppz2 and Ppz3 generated in the semiconductor layers, respectively. Therefore, there is no need to change the composition ratio of the second semiconductor layer in the film thickness direction for the purpose of changing the band structure to reduce a resistance in the second semiconductor layer. As a result, it is possible to prevent a method for fabricating a semiconductor device from becoming complicated and also to stably obtain a quality semiconductor device.

Moreover, a third aspect of the present invention is assumed to be a semiconductor device including: an n-type first semiconductor layer formed so that electrons are externally injected into the first semiconductor layer; a p-type second semiconductor layer formed so that electrons injected into the first semiconductor layer are injected into the second semiconductor layer; and an n-type third semiconductor layer formed so that electrons having passed through the second semiconductor layer flow into the third semiconductor layer, the first, second and third semiconductor layers being in contact with one another in this order. A spontaneous polarization Psp1 and a piezo polarization Ppz1 are generated in the first semiconductor layer, a spontaneous polarization Psp2 and a piezo polarization Ppz2 are generated in the second semiconductor layer, a spontaneous polarization Psp3 and a piezo polarization Ppz3 are generated in the third semiconductor layer, respective polarities of the spontaneous polarizations are the same as respective polarities of the piezo polarizations, respectively, and the second semiconductor layer is formed so as to have a configuration in which an internal electric field is generated so that an energy of electrons decreases in the direction from the first semiconductor layer to the third semiconductor layer due to an electric charge Q12 generated at an interface with the first semiconductor layer by an interaction of the spontaneous polarization Psp1, the piezo polarization Ppz1, the spontaneous polarization Psp2 and the piezo polarization Ppz2 and an electric charge Q23 generated at an interface with the third semiconductor layer by an interaction of the spontaneous polarization Psp2, the piezo polarization Ppz2, the spontaneous polarization Psp3 and the piezo polarization Ppz3.

In this structure, the respective polarities of the spontaneous polarizations Psp1, Psp2 and Psp3 are the same as the respective polarities of the piezo polarizations Ppz1, Ppz2 and Ppz3, respectively. Thus, the spontaneous polarizations Psp1, Psp2 and Psp3 and the piezo polarizations Ppz1, Ppz2 and Ppz3 do not cancel to each other, so that the very large electric charge Q12 is generated at the interface of the first semiconductor layer and the second semiconductor layer and the very large electric charge Q23 is generated at the interface of the second semiconductor layer and the third semiconductor layer. With the electric charges Q12 and Q23, an internal electric field is generated in the p-type second semiconductor layer, so that the energy of electrons as carriers decreases in a moving direction. Accordingly, electrons injected from the first semiconductor layer are accelerated by the internal electric field in the direction from the first semiconductor layer to the third semiconductor layer and thus the transit time of electrons traveling in the second semiconductor layer toward the third semiconductor layer can be efficiently and reliably reduced. Therefore, high-frequency characteristics can be improved. When the semiconductor device is applied to an HBT, holes are stored in the vicinity of the base electrode due to the internal electric field. Therefore, a base resistance can be reduced.

Moreover, the internal electric field is generated by actions of the spontaneous polarizations Psp1, Psp2 and Psp3 and the piezo polarizations Ppz1, Ppz2 and Ppz3 generated in the semiconductor layers, respectively. Therefore, there is no need to change the composition ratio of the second semiconductor layer in the film thickness direction for the purpose of changing the band structure to reduce a resistance in the second semiconductor layer. As a result, it is possible to prevent a method for fabricating a HBT from becoming complicated and also to stably obtain a quality semiconductor device.

Moreover, in one embodiment of the semiconductor device, each of the first and third semiconductor layers is formed of aluminum gallium nitride (AlGaN), and the second semiconductor layer is formed of gallium nitride (GaN).

In this structure, the respective polarities of the spontaneous polarizations Psp1, Psp2 and Psp3 are the same as the respective polarities of the piezo polarizations Ppz1, Ppz2 and Ppz3, respectively. Thus, the spontaneous polarizations Psp1, Psp2 and Psp3 and the piezo polarizations Ppz1, Ppz2 and Ppz3 do not cancel to each other, so that the very large electric charge Q12 is generated at the interface of the first semiconductor layer and the second semiconductor layer and the very large electric charge Q23 is generated at the interface of the second semiconductor layer and the third semiconductor layer. With the electric charges Q12 and Q23, a very large internal electric field is generated in the second semiconductor layer, so that the transit time of electrons in the second semiconductor layer can be efficiently and reliably reduced. Furthermore, the first semiconductor layer and the second semiconductor layer form a hetero-junction, so that the efficiency of injection into the second semiconductor layer can be improved.

Moreover, it is preferable that the first semiconductor layer has a higher aluminum composition ratio than that of the third semiconductor layer.

In this structure, a barrier at the interface of the first semiconductor layer and the second semiconductor layer is higher than that at the interface of the second semiconductor layer and the third semiconductor layer. Accordingly, when electrons injected from the first semiconductor layer pass through the second semiconductor layer to reach the third semiconductor layer, the electrons have enough energy to go over the barrier at the interface of the second semiconductor layer and the third semiconductor layer. Therefore, the transit time of carriers can be reduced, so that high-frequency characteristics can be improved.

Moreover, in one embodiment of the semiconductor device, the first semiconductor layer is formed of AlGaN, and each of the second and third semiconductor layers is formed of GaN.

In this structure, the respective polarities of the spontaneous polarizations Psp1, Psp2 and Psp3 are the same as the respective polarities of the piezo polarizations Ppz1, Ppz2 and Ppz3. Thus, the spontaneous polarizations Psp1, Psp2 and Psp3 and the piezo polarizations Ppz1, Ppz2 and Ppz3 do not cancel to each other, so that the sufficiently large electric charge Q12 is generated at the interface of the first semiconductor layer and the second semiconductor layer and the sufficiently large electric charge Q23 is generated at the interface of the second semiconductor layer and the third semiconductor layer. With the electric charges Q12 and Q23, a sufficiently large internal electric field is generated in the second semiconductor layer, so that the transit time of electrons in the second semiconductor layer can be efficiently and reliably reduced. Furthermore, a barrier is not generated at the interface of the second semiconductor layer and the third semiconductor layer. Also in this point, a transit time of carriers can be reduced, so that high-frequency characteristics can be improved.

Moreover, a fourth aspect of the present invention is assumed to be a semiconductor device including: an n-type first semiconductor layer formed so that electrons are externally injected into the first semiconductor layer; a p-type second semiconductor layer formed so that electrons injected into the first semiconductor layer are injected into the second semiconductor layer; and an n-type third semiconductor layer formed so that electrons having passed through the second semiconductor layer flow into the third semiconductor layer, the first, second and third semiconductor layers being in contact with one another in this order. The second semiconductor layer is formed of gallium nitride, the first semiconductor layer is in contact with a nitrogen polarity surface of the second semiconductor layer, and the third semiconductor layer is in contact with a gallium polarity surface of the second semiconductor layer.

In this structure, the second semiconductor layer is in contact with the first semiconductor layer at its nitrogen polarity surface while being in contact with the third semiconductor layer at its gallium polarity surface. Thus, in the second semiconductor layer, due to the spontaneous polarization, the interface with the first semiconductor layer becomes a negative polarity and the interface with the third semiconductor layer becomes a positive polarity. With the electric charges generated at the interfaces, an internal electric field is generated in the second semiconductor layer so that electrons as carries are accelerated in the direction from the first semiconductor layer to the third semiconductor layer. As a result, the transit time of electrons traveling in the second semiconductor layer toward the third semiconductor layer can be reduced. Therefore, high-frequency characteristics can be improved. When the semiconductor device is applied to an HBT, holes are stored in the vicinity of the base electrode due to the internal electric field. Therefore, a base resistance can be reduced. Furthermore, the internal electric field is generated by actions of the spontaneous polarizations. Therefore, there is no need to change the composition ratio of the second semiconductor layer in the film thickness direction for the purpose of changing the band structure to reduce a resistance in the second semiconductor layer. As a result, it is possible to prevent a method for fabricating a semiconductor device from becoming complicated and also to stably obtain a quality semiconductor device.

Moreover, in one embodiment of the semiconductor device, each of the first and third semiconductor layers is formed of AlGaN.

In this structure, the respective polarities of the spontaneous polarizations generated in the semiconductor layers are the same as the respective polarities of the piezo polarizations generated in the semiconductor layers, respectively. Thus, the spontaneous polarizations and the piezo polarizations do not cancel to each other, so that a very large electric charge is generated at the interface of the first semiconductor layer and the second semiconductor layer and a very large electric charge is generated at the interface of the second semiconductor layer and the third semiconductor layer. With the electric charges, a very large internal electric field is generated in the second semiconductor layer, so that the transit time of electrons in the second semiconductor layer can be efficiently and reliably reduced. Furthermore, the first semiconductor layer and the second semiconductor layer form a hetero-junction, so that the efficiency of injection into the second semiconductor layer can be improved.

Moreover, in the semiconductor device, it is preferable that the first semiconductor layer has a higher aluminum composition ratio than that of the third semiconductor layer.

In this structure, a barrier at the interface of the first semiconductor layer and the second semiconductor layer is higher than that at the interface of the second semiconductor layer and the third semiconductor layer. Accordingly, when electrons injected from the first semiconductor layer pass through the second semiconductor layer to reach the third semiconductor layer, the electrons have enough energy to go over the barrier at the interface of the second semiconductor layer and the third semiconductor layer. Therefore, the transit time of carriers can be reduced, so that high-frequency characteristics can be improved.

Moreover, in one embodiment of the semiconductor device, the first semiconductor layer is formed of AlGaN, and the third semiconductor layer is formed of GaN.

In this structure, the respective polarities of the spontaneous polarizations generated in the semiconductor layers are the same as the respective polarities of the piezo polarizations generated in the semiconductor layers, respectively. Thus, the spontaneous polarizations and the piezo polarizations do not cancel to each other, so that a sufficiently large electric charge is generated at the interface of the first semiconductor layer and the second semiconductor layer and a sufficiently large electric charge is generated at the interface of the second semiconductor layer and the third semiconductor layer. With the electric charges, a sufficiently large internal electric field is generated in the second semiconductor layer, so that the transit time of electrons in the second semiconductor layer can be efficiently and reliably reduced. Furthermore, a barrier is not generated at the interface of the second semiconductor layer and the third semiconductor layer. Also in this point, the transit time of carriers can be reduced, so that high-frequency characteristics can be improved.

Moreover, the semiconductor device may have a configuration in which the first, second and third semiconductor layers are stacked in this order from a substrate side.

Moreover, in one embodiment of the semiconductor device, at least one of the first and third semiconductor layers of aluminum gallium nitride is doped with an impurity at a concentration of $1\times10^{18}$ to $1\times10^{19}$ cm$^{-3}$.

In this structure, at least one of the first semiconductor layer and the third semiconductor layer is formed of a heavily doped layer containing an impurity at a high concentration, so that a layer formed of AlGaN becomes a low potential portion and thus carriers can pass through this portion. Accordingly, if the first semiconductor layer is formed of a heavily doped layer, carriers can be efficiently injected into the second semiconductor layer from the first semiconductor layer. On the other hand, if the third semiconductor layer is formed of a heavily doped layer, carriers having passed through the second semiconductor layer can be efficiently taken out from the third semiconductor layer. Specifically, in the structure in which the first semiconductor layer, the second semiconductor layer and the third semiconductor layer are stacked in this order from a substrate side, carriers are hardly injected into the second semiconductor layer from the first semiconductor layer and also carriers hardly flow into the third semiconductor layer from the second semiconductor layer. Therefore, it is very effective to form each of the first semiconductor layer and the third semiconductor layer as a heavily doped layer.

Moreover, in one embodiment of the semiconductor layer, a heavily doped layer formed by δ doping is provided in at least one of the first and third semiconductor layers formed of AlGaN.

In this structure, a low potential portion is formed in a layer formed of AlGaN, so that carriers can pass through the portion. Thus, carriers can be efficiently injected into the second semiconductor layer from the first semiconductor layer or carriers having passed through the second semiconductor layer can be made to efficiently flow into the third semiconductor layer. Moreover, the heavily doped layer is formed by δ doping, so that the heavily doped layer is formed in part of the first semiconductor layer and/or the third semiconductor layer. As a result, distortion generated at the interface of AlGaN and GaN is not eased and a low potential portion can be formed in at least one of the first semiconductor layer and the third semiconductor layer. Accordingly, an internal electric field generated in the second semiconductor layer is not reduced, so that the efficiency of carrier injection can be improved. Therefore, the transit time of carriers can be reduced, so that high-frequency characteristics can be improved.

Moreover, in one embodiment of the semiconductor device, in the first semiconductor layer, an electrode is in contact with a surface of the first semiconductor layer located on an opposite side to the second semiconductor layer, and the heavily doped layer is provided in the first semiconductor layer so as to be located at a distance of 20 nm or less from the surface with which the electrode is in contact.

In this structure, the heavily doped layer is provided in the first semiconductor layer so as to be located at a distance of 20 nm or less from the surface with which the electrode is in contact. Thus, injection of electrons from the electrode can be efficiently performed. Accordingly, the efficiency of carrier injection can be improved. Therefore, the transit time of carriers can be reduced, so that high-frequency characteristics can be improved.

Moreover, in one embodiment of the semiconductor device, the heavily doped layer is provided in the third semiconductor layer so as to be located at a distance of 20 nm or less from the interface with the second semiconductor layer.

In this structure, the heavily doped layer is provided in the third semiconductor layer so as to be located at a distance of 20 nm or less from the interface of the second semiconductor layer and the third semiconductor layer. Thus, electrons in the second semiconductor layer efficiently flow into the third semiconductor layer. Accordingly, the efficiency of carrier injection can be improved. Therefore, the transit time of carriers can be reduced, so that high-frequency characteristics can be improved.

Moreover, in one embodiment of the semiconductor device, in the second semiconductor layer, a thin layer portion is formed, with an interface with the first semiconductor layer left, so as to have a smaller thickness than that of other part, and in the thin layer portion, an electrode for taking out electrons in the second semiconductor layer is in contact with the thin layer portion.

In this structure, the interface of the first semiconductor layer of AlGaN and the thin layer portion of the second semiconductor layer of GaN is a hetero-junction interface and the first semiconductor layer and the thin layer portion have different bands. Moreover, in the second semiconductor layer, an internal electric field is generated to extend from the third semiconductor layer to the first semiconductor layer. Accordingly, electrons are accelerated in the direction from the first semiconductor layer to the third semiconductor layer due to the internal electrode. Therefore, the transit time of carriers can be reduced, so that high-frequency characteristics can be improved. Moreover, holes are stored in the vicinity of the interface with the first semiconductor layer due to the internal electric field in the second semiconductor layer, so that holes are stored in the vicinity of the electrode in contact with the thin layer portion of the second semiconductor layer. Therefore, a resistance of the second semiconductor layer can be reduced.

Moreover, in one embodiment of the semiconductor device, in the first semiconductor layer, a contact layer of n-type GaN is in contact with a surface of the first semiconductor layer located in an opposite side to the second semiconductor layer, and the first semiconductor layer and the electrode for injecting electrons into the first semiconductor layer form an ohmic contact with the contact layer interposed therebetween.

In this structure, the contract layer of GaN is in contact with the first semiconductor layer of AlGaN and the electrode is in contact with the contact layer. The interface of the first semiconductor layer and the contact layer is a heterojunction interface. Moreover, because of a difference in polarity characteristics between AlGaN and GaN, conduction electrons (two-dimensional conduction electron gas) are stored in the contact layer side of the interface of the first semiconductor layer and the contact layer. Accordingly, the conduction electrons can be used for forming an ohmic contact with the electrode and then a low resistance ohmic contact can be formed. Therefore, high-frequency characteristics can be improved.

Moreover, in one embodiment of the semiconductor layer, in the first semiconductor layer, while a contact layer of n-type gallium nitride is in contact with a surface of the first semiconductor layer located on an opposite side to the second semiconductor layer, a thin layer portion is formed, with an interface with the contact layer left, so as to have a smaller thickness than that of other part, and an electrode for injecting electrons is in contact with the thin layer portion.

In this structure, the interface of the first semiconductor layer of AlGaN and the contact layer of GaN is a hetero-junction interface. Moreover, because of a difference in polarity characteristics between AlGaN and GaN, conduction electrons are stored in the contact layer side of the interface of the first semiconductor layer and the contact layer. Accordingly, the conduction electrons can be used for forming an ohmic contact with the electrode and a low resistance ohmic contact can be formed. Therefore, high-frequency characteristics can be improved.

Moreover, in one embodiment of the semiconductor device, the first semiconductor layer is formed as an emitter layer, the second semiconductor layer is formed as a base layer, and the third semiconductor layer is formed as a collector layer.

Moreover, a fifth aspect of the present invention is assumed to be a hetero-junction bipolar transistor including: an emitter layer formed of n-type semiconductor; a base layer formed of p-type semiconductor; and a collector layer formed of n-type semiconductor, the emitter, base and collector layers being in contact with one another in this order. The base layer is formed of GaN, the emitter layer is in contact with a nitrogen polarity surface of the base layer, and the collector layer is in contact with a gallium polarity surface of the base layer.

In this structure, the base layer is in contact with the emitter layer at its nitrogen polarity surface while being in contact with the collector layer at its gallium polarity surface. Thus, in the base layer, due to the spontaneous polarization, the interface with the emitter layer becomes a negative polarity and the interface with the collector layer becomes a positive polarity. With electric charges generated at the interfaces, an internal electric field is generated in the base layer so that electrons as carries are accelerated in the direction from the first semiconductor layer to the third semiconductor layer. As a result, the transit time of electrons injected from the emitter layer and traveling in the base layer toward the collector layer can be reduced. Therefore, high-frequency characteristics can be improved. Moreover, holes are stored in the vicinity of the base electrode due to the internal electric field. Thus, a base resistance can be reduced. Furthermore, the internal electric field is generated by actions of the spontaneous polarizations. Therefore, there is no need to change the composition ratio of the base layer in the film thickness direction for the purpose of changing the band structure to reduce a resistance in the base layer. As a result, it is possible to prevent a method for fabricating a HBT from becoming complicated and also to stably obtain an HBT.

Moreover, in one embodiment of the HBT, each of the emitter layer and the collector layer is formed of AlGaN.

In this structure, the respective polarities of the spontaneous polarizations generated in the emitter layer, the base layer, and the collector layer are the same as the respective polarities of the piezo polarizations generated in the emitter, base and collector layers. Thus, the spontaneous polarizations and the piezo polarizations do not cancel to each other, so that a very large electric charge is generated at the interface of the emitter layer and the base layer and a very large electric charge is generated at the interface of the base layer and the collector layer. With the electric charges, a very large internal electric field is generated in the base layer, so that the transit time of electrons in the base layer can be efficiently and reliably reduced. Furthermore, the emitter layer and the base layer form a hetero-junction, so that the efficiency of electron injection can be improved.

Moreover, in one embodiment of the HBT, the emitter layer is formed of AlGaN, and the collector layer is formed of GaN.

In this structure, the respective polarities of the spontaneous polarizations generated in the emitter layer, the base layer, and the collector layer are the same as the respective polarities of the piezo polarizations generated in the emitter, base and collector layers. Thus, the spontaneous polarizations and the piezo polarizations do not cancel to each other, so that a sufficiently large electric charge is generated at the interface of the emitter layer and the base layer and a sufficiently large electric charge is generated at the interface of the base layer and the collector layer. With the electric charges, a sufficiently large internal electric field is generated in the base layer, so that the transit time of electrons in the base layer can be efficiently and reliably reduced. Furthermore, a barrier is not generated at the interface of the base layer and the collector layer. Also in this point, the transit time of carriers can be reduced, so that high-frequency characteristics can be improved.

According to the invention of claim 1, in the second semiconductor layer, the internal electric field to be generated due to the respective spontaneous polarization in the semiconductor layers is generated so that the energy of electrons as carriers decreases in the direction from the first semiconductor layer to the third semiconductor layer. Thus, the transit time of electrons injected from the first semiconductor layer and traveling in the second semiconductor layer toward the third semiconductor layer can be reduced, so that high-frequency characteristics can be improved. Moreover, the respective spontaneous polarizations generated in the semiconductor layers are utilized and, therefore, there is no need to change the composition ratio of the second semiconductor layer in the film thickness direction for the purpose of changing the band structure to reduce a resistance in the second semiconductor layer. As a result, it is possible to prevent a method for fabricating a semiconductor device from becoming complicated and also to stably obtain a quality semiconductor device.

According to the invention of claim 2, in the second semiconductor layer, the internal electric field to be generated due to the respective piezo polarization in the semiconductor layers is generated so that the energy of electrons as carriers decreases in the direction from the first semiconductor layer to the third semiconductor layer. Thus, the transit time of electrons injected from the first semiconductor layer and traveling in the second semiconductor layer toward the third semiconductor layer can be reduced, so that high-frequency characteristics can be improved. Moreover, the respective piezo polarizations generated in the semiconductor layers are utilized and, therefore, there is no need to change the composition ratio of the second semiconductor layer in the film thickness direction for the purpose of changing the band structure to reduce a resistance in the second semiconductor layer. As a result, it is possible to prevent a method for fabricating a semiconductor device from becoming complicated and also to stably obtain a quality semiconductor device.

According to the invention of claim 3, the respective polarities of spontaneous polarizations generated in the semiconductor layers are the same as the respective polarities of piezo polarizations generated in the semiconductor layer, respectively, so that the spontaneous polarizations and the piezo polarizations do not cancel to each other and a very large electric charge is generated at each interface. Thus, the transit time of electrons traveling in the second semiconductor layer toward the third semiconductor layer can be efficiently and reliably reduced, so that high-frequency characteristics can be improved. Moreover, the spontaneous polarizations and piezo polarizations generated in the semiconductor layers are utilized and, therefore, there is no need to change the composition ratio of the second semiconductor layer in the film thickness direction for the purpose of changing the band structure to reduce a resistance in the second semiconductor layer. As a result, it is possible to prevent a method for fabricating a semiconductor device from becoming complicated and also to stably obtain a quality semiconductor device.

According to the invention of claim 4, each of the first semiconductor layer and the third semiconductor layer is formed of AlGaN and the second semiconductor layer is formed of GaN. Thus, a very large electric charge can be generated at the interface of each semiconductor layer and due to an internal electric field generated by the electric charge, the transit time of electrons in the second semiconductor layer can be efficiently and reliably reduced. Moreover, the interface of the first semiconductor layer and the second semiconductor layer is a hetero-junction, so that the efficiency of injection into the second semiconductor layer can be improved.

According to the invention of claim 5, the first semiconductor layer has a higher aluminum composition ratio than that of the third semiconductor layer. Thus, carriers can easily go over a barrier generated at the interface of the second semiconductor layer and the third semiconductor layer. Therefore, the transit time of electrons can be reduced, so that high-frequency characteristics can be improved.

According to the invention of claim 6, the first embodiment is formed of AlGaN and each of the second semiconductor layer and the third semiconductor layer is formed of GaN, so that a sufficiently large electric charge can be generated at each interface and due to an internal electric fields generated by the electric charge, the transit time of electrons in the second semiconductor layer can be efficiently and reliably reduced. Moreover, a barrier is not generated at the interface of the second semiconductor layer and the third semiconductor layer. Also in this point, the transit time of carriers can be reduced, so that high-frequency characteristics can be improved.

According to the invention of claim 7, the first semiconductor layer is in contact with a nitrogen polarity surface of the second semiconductor layer of GaN and also the third semiconductor layer is in contact with a gallium polarity surface of the second semiconductor layer. Thus, in the second semiconductor layer, an internal electric field can be generated so that electrons as carriers are accelerated in the direction from the first semiconductor layer to the third semiconductor layer due to the spontaneous polarizations. Therefore, the transit time of electrons can be reduced, so that high-frequency characteristics can be improved. Moreover, there is no need to change the composition ratio of the second semiconductor layer in the film thickness direction, so that it is possible to prevent a method for fabricating a HBT from becoming complicated and also to stably obtain a quality semiconductor device.

According to the invention of claim 8, each of the first semiconductor layer and the third semiconductor layer is formed of AlGaN and the second semiconductor layer is formed of GaN. Thus, a very large electric charge can be generated at each interface and due to an internal electric field generated by the electric charge, the transit time of electrons in the second semiconductor layer can be efficiently and reliably reduced. Moreover, the interface of the first semiconductor layer and the second semiconductor layer is a hetero-junction, so that the efficiency of injection into the second semiconductor layer can be improved.

According to the invention of claim 9, the first semiconductor layer has a higher aluminum composition ratio than that of the third semiconductor layer. Thus, carriers can easily go over a barrier generated at the interface of the second semiconductor layer and the third semiconductor layer. Therefore, the transit time of carriers can be reduced, so that high-frequency characteristics can be improved.

According to the invention of claim 10, the first semiconductor layer is formed of AlGaN and each of the second semiconductor layer and the third semiconductor layer is formed of GaN. Thus, a sufficiently large electric charge can be generated at each interface and due to an internal electric field generated by the electric charge, the transit time of electrons in the second semiconductor layer can be efficiently and reliably reduced. Moreover, a barrier is not generated at the interface of the second semiconductor layer and the third semiconductor layer. Also in this point, the transit time of carriers can be reduced, so that high-frequency characteristics can be improved.

According to the invention of claim 12, at least one of the first semiconductor layer and the third semiconductor layer is doped with an impurity at a high concentration. Thus, the potentials of the semiconductor layers can be reduced. Therefore, carriers can be efficiently injected into the second semiconductor layer from the first semiconductor layer or carriers having passed through the second semiconductor layer can be efficiently taken out from the third semiconductor layer.

According to the invention of claim 13, a heavily doped layer formed by δ doping is provided in at least one of the first semiconductor layer and the third semiconductor layer, so that distortion generated at the interface of AlGaN and GaN is not eased and a low potential portion can be formed in at least one of the first semiconductor layer and the third semiconductor layer. Accordingly, the intensity of an internal electric field generated in the second semiconductor layer is not reduced, so that the efficiency of carrier injection can be improved. Therefore, the transit time of carriers can be reduced, so that high-frequency characteristics can be improved.

According to the invention of claim 14, the heavily doped layer is provided in the first semiconductor layer so as to be located at a distance of 20 nm or less from a surface opposite side to the second semiconductor layer. Thus, the efficiency of carrier injection from the electrode provided on a surface thereof can be improved. Accordingly, the transit time of carriers can be reduced, so that high-frequency characteristics can be improved.

According to the invention of claim 15, the heavily doped layer is provided in the third semiconductor layer so as to be located at a distance of 20 nm or less from the interface with the second semiconductor layer. Thus, the efficiency of making electrons in the second semiconductor layer flow into the third semiconductor layer can be improved. Accordingly, the transit time of carriers can be reduced, so that high-frequency characteristics can be improved.

According to the invention of claim 16, a thin layer portion is formed so that the interface with the first semiconductor layer is left in the second semiconductor layer and an electrode for taking out electrons in the second semiconductor layer is in contact with the thin layer portion. Thus, due to the internal electric field generated in the second semiconductor layer, holes are stored in the vicinity of the interface with the first semiconductor layer in the thin layer portion. As a result, holes are stored in the vicinity of the electrode in contact with the thin layer portion of the second semiconductor layer, so that a resistance in the second semiconductor layer can be reduced.

According to the invention of claim 17, the contact layer of n-type GaN is in contact with the first semiconductor layer and the first semiconductor layer and the electrode for injecting electrons into the first semiconductor layer form an ohmic contact with the contact layer interposed therebetween, so that conduction electrons are stored in the contact layer side of the interface of the first semiconductor layer and the contact layer. Thus, conduction electrons can be used for forming an ohmic contact with the electrode and a low resistance ohmic contact can be formed. Therefore, high-frequency characteristics can be improved.

According to the invention of claim 18, the contact layer of n-type GaN is in contact with the first semiconductor layer, a thin layer portion is formed so that the interface with the contact layer is left, and the electrode is in contact with the thin layer portion. Thus, conduction electrons are stored in the contact layer side of the interface of the thin layer portion of the first semiconductor layer and the contact layer. Therefore, the conduction electrons can be used for forming an ohmic contact with the electrode and a low resistance ohmic contact can be formed. Therefore, high-frequency characteristics can be improved.

According to the invention of claim 20, a base layer of an HBT is formed of GaN and the base layer is in contact with an emitter layer at its nitrogen polarity surface while being in contact with the collector layer at its gallium polarity surface. Thus, an internal electric field can be generated in the base layer so that electrons as carriers are accelerated in the direction from the emitter layer to the collector layer. Therefore, the transit time of electrons can be reduced, so that high-frequency characteristics can be improved. Moreover, due to the internal electric field, holes can be stored in the vicinity of the base electrode, so that a base resistance can be reduced. Furthermore, there is no need to change the composition ratio of the base layer in the film thickness direction. As a result, it is possible to prevent a fabrication method from becoming complicated and also to stably obtain a quality HBT.

According to the invention of claim 21, each of the emitter layer and the collector layer is formed of AlGaN. Thus, a very large electric charge is generated at the interface of the emitter layer and the base layer and a very large internal electric field can be generated in the base layer. As a result, the transit time of electrons in the base layer can be efficiently and reliably reduced. Furthermore, the interface of the emitter layer and the base layer is a hetero-junction, so that the efficiency of injection into the base layer can be improved.

According to the invention of claim 22, the emitter layer is formed of AlGaN and the collector layer is formed of GaN. Thus, a sufficiently large electric charge is generated at each interface and a sufficiently large internal electric field can be formed in the base layer. As a result, the transit time of electrons in the base layer can be efficiently and reliably reduced. Furthermore, in the present invention, a barrier is not generated at the interface of the base layer and the collector layer. Also in this point, the transit time of carriers can be reduced, so that high-frequency characteristics can be improved.

DESCRIPTION OF THE PREFERRED EMBODIMENTS

Figure 1A:
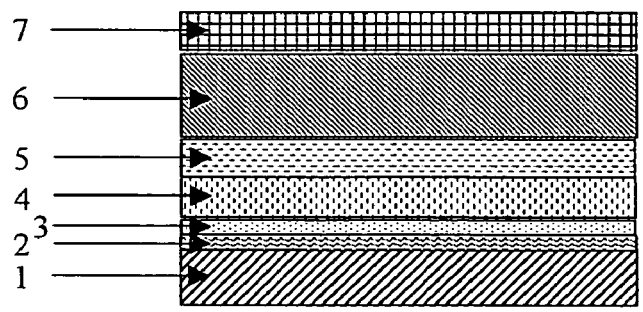
FIG. 1 shows cross-sectional views illustrating the entire structure of an HBT according to EMBODIMENT 1 of the present invention.

Hereinafter, embodiments of the present invention will be described in detail with reference to the accompanying drawings.

Embodiment 1

As shown in FIG. 1, a semiconductor device according to EMBODIMENT 1 is formed as a hetero-junction bipolar transistor (HBT) in which an emitter layer 4 as a first semiconductor layer, a base layer 5 as a second semiconductor layer, and a collector layer 6 as a third semiconductor layer are formed over a sapphire substrate 1. Each of the layers is formed by metal organic chemical deposition (MOCVD).

On the sapphire substrate 1, an AlN buffer layer 2 of aluminum nitride (AlN) is formed. The AlN buffer layer 2 is formed so as to have a thickness of 20 nm. On the AlN buffer layer 2, a GaN buffer layer 3 of gallium nitride (GaN) is formed. The GaN buffer layer 3 is formed so as to have a thickness of 15 nm. The GaN buffer layer 3 is formed by MOCVD and thus a surface (upper surface) thereof at a time when the GaN buffer layer is formed is a gallium polarity surface in which gallium is located at the outermost side. Moreover, an interface (lower surface) of the GaN buffer layer 3 with the AlN buffer layer 2 is a nitrogen polarity surface in which nitrogen is located in the outermost side.

The emitter layer 4 is formed on the GaN buffer layer 3. The emitter layer 4 is formed of n-type aluminum gallium nitride (AlGaN) so as to have a thickness of 30 nm. Silicon (Si) is added as an impurity to AlGaN at a medium concentration ($5 \times 10^{17}$ cm$^{-3}$) so that the aluminum composition rate of the emitter layer 4 is 25%.

The base layer 5 is formed on the emitter layer 4 so as to have a thickness of 70 nm. The base layer 5 is formed of p-type GaN. That is, the junction of the emitter base layer 4 and the base layer 5 is a heterojunction in which the base layer 5 has a narrow gap with respect to the emitter layer 4. Magnesium (Mg) is added as an impurity to GaN which forms the base layer 5 at a high concentration ($4\times10^{19}$ cm$^{-3}$). The concentration of the impurity is constant in the film thickness direction and thus the base layer 5 has a constant band gap in the film thickness direction.

The collector layer 6 is formed on the base layer 5 so as to have a thickness of 500 nm. The collector layer 6 is formed of n-type AlGaN. That is, the junction of the base layer 5 and the collector layer 6 is a hetero-junction in which the base layer 5 has a narrow gap with respect to the collector layer 6. Si is added as an impurity to AlGaN of the collector layer 6 at a medium concentration ($2\times10^{17}$ cm$^{-3}$) and the aluminum composition of the collector layer 6 is 10%. That is, in EMBODIMENT 1, the aluminum composition of the emitter layer 4 is higher than that of the collector layer 6.

On the collector layer 6, a subcollector layer 7 of n-type GaN is formed. The subcollector layer 7 is formed so as to have a thickness of 500 nm. Si is added as an impurity to GaN forming the subcollector layer 7 at a high concentration ($1\times10^{19}$ cm$^{-3}$).

On respective upper surfaces of the emitter layer 4, the base layer 5 and the subcollector layer 7, electrodes 8 are provided, respectively. An electrode 8 in contact with the emitter layer 4 forms an emitter electrode and is configured so that electrons are externally injected into the electrode. Moreover, an electrode 8 in contact with the base layer 5 forms a base electrode and is so configured to take out part of electrons injected into the emitter layer 4 from the base layer 5. Moreover, an electrode 8 in contact with the subcollector layer 7 forms a collector electrode and is so configured to take out electrons which have passed through the base layer 5.

Figure 1B:
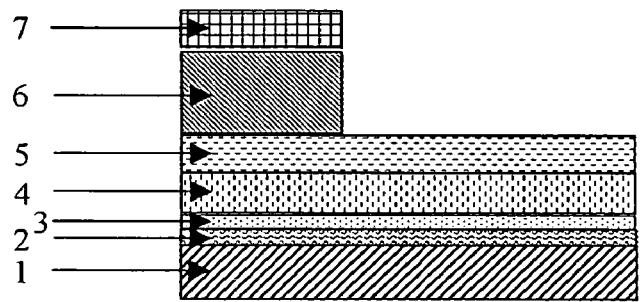
Figure 1C:
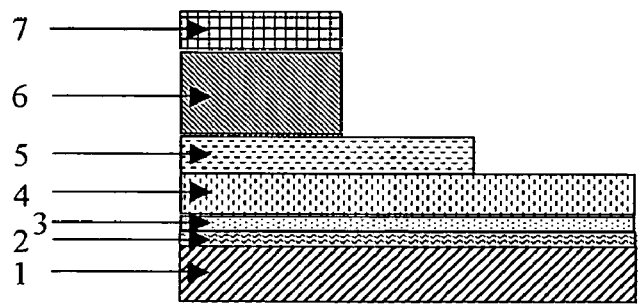
Figure 1D:
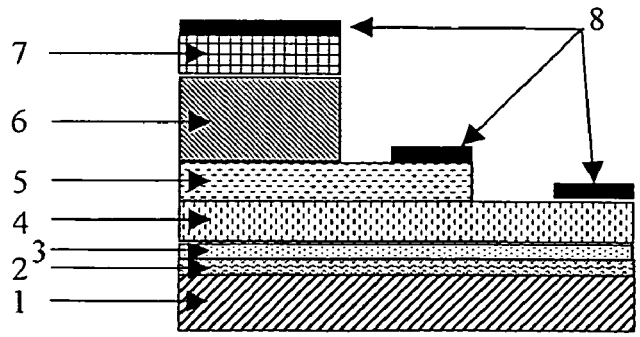

A method for fabricating an HBT according to EMBODIMENT 1 will be described. As shown in FIG. 1(a), an AlN buffer layer 2, a GaN buffer layer 3, an emitter layer 4, a base layer 5, a collector layer 6 and a sub-collect layer 7 are formed on a sapphire substrate 1 in this order. In this case, each of the layers is formed by MOCVD. Then, as shown in FIG. 1(b), with an Si oxide film as a mask, the subcollector layer 7 and the collector layer 6 are etched in this order by dry etching using chloride gas, thereby forming a collector mesa and having the base layer 5 exposed. Next, as shown in FIG. 1(c), with the Si oxide film as a mask, the base layer 5 is etched by dry etching using chloride gas, thereby having the emitter layer 4 exposed. Then, as shown in FIG. 1(d), an electrode 8 is formed on each of the subcollector layer 7, the base layer 5 and the emitter layer 4. Thus, the HBT of EMBODIMENT 1 can be formed.

Figure 2:
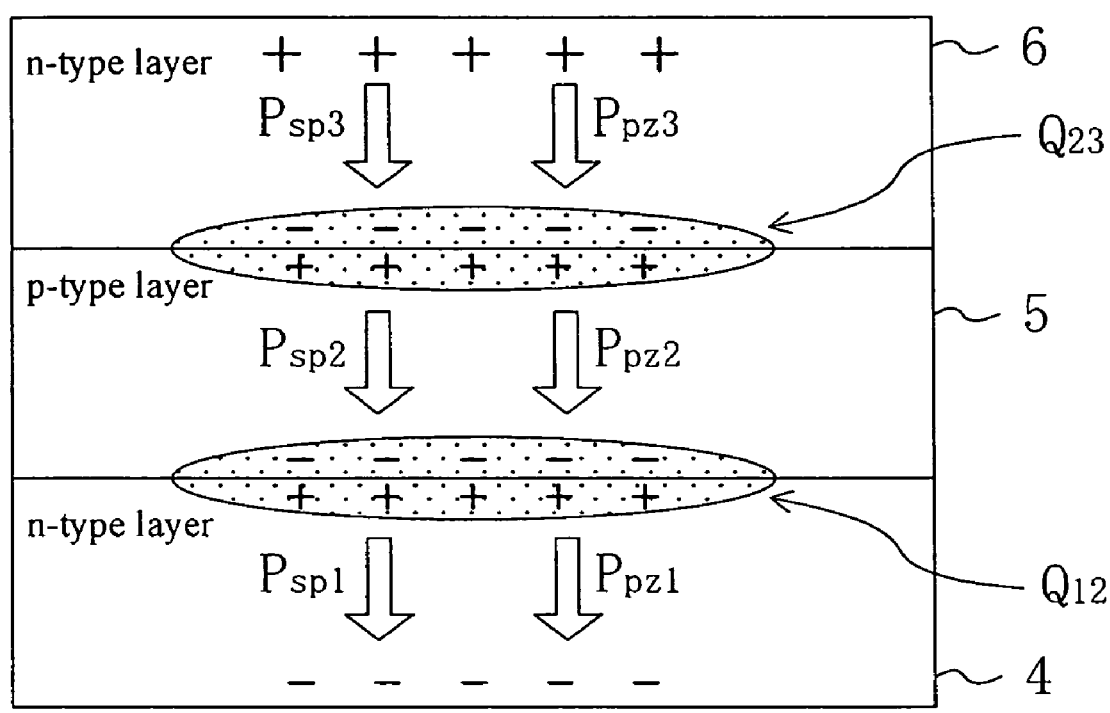
FIG. 2 is a view illustrating polarizations and electric fields generated in the HBT of EMBODIMENT 1 of the present invention.

Polarizations generated in the emitter layer 4, the base layer 5 and the collector layer 6 will be described with reference to FIG. 2. The emitter layer 4 is made of AlGaN, as has been described above, and formed on a gallium polarity surface of the GaN buffer layer 3. Thus, the emitter layer 4 has a lower surface of a nitrogen polarity surface and an upper surface of an aluminum gallium polarity surface, and a spontaneous polarization Psp1 is generated. Moreover, in the emitter layer 4, a piezo polarization Ppz1 due to crystal strains is generated. In AlGaN, the piezo polarization Ppz1 is generated to have the same polarity as that of the spontaneous polarization Psp1. With the spontaneous polarization Psp1 and the piezo polarization Ppz1 generated, the emitter layer 4 has a lower surface of a negative polarity surface and an upper layer of a positive surface.

The base layer 5 is formed on the aluminum gallium polarity surface of the emitter layer 4. Thus, a lower surface of the base layer 5 is a nitrogen polarity surface and an upper surface thereof is a gallium polarity surface and a spontaneous polarization Psp2 is generated. Moreover, in the base layer 5, a piezo polarization Ppz2 due to crystal strains is generated. Since the base layer 5 is formed of GaN, the piezo polarization Ppz2 is generated to have the same polarity as that of the spontaneous polarization Psp2. With the spontaneous polarization Psp2 and the piezo polarization Ppz2 generated, the base layer 5 has a lower surface of a negative polarity surface and an upper layer of a positive surface.

The collector layer 6 is formed on the gallium polarity surface of the base layer 5. Thus, a lower surface of the collector layer 6 is a nitrogen polarity surface and an upper surface thereof is an aluminum gallium polarity surface and a spontaneous polarization Psp3 is generated. Moreover, in the collector layer 6, a piezo polarization Ppz3 due to crystal strains is generated. Since the collector layer 6 is formed of AlGaN, the piezo polarization Ppz3 is generated to have the same polarity as that of the spontaneous polarization Psp3. With the spontaneous polarization Psp3 and the piezo polarization Ppz3 generated, the collector layer 6 has a lower surface of a negative polarity surface and an upper layer of a positive polarity surface.

Polarities of the spontaneous polarizations Psp1 and Psp2 are the same as polarities of the piezo polarizations Ppz1 and Ppz2, respectively. Therefore, a very large electric charge Q12 is generated at the interface of the emitter layer 4 and the base layer 5. Moreover, polarities of the spontaneous polarizations Psp2 and Psp3 are the same as polarities of the piezo polarizations Ppz2 and Ppz3, respectively. Therefore, a very large electric charge Q23 is generated at the interface of the base layer 5 and the collector layer 6. Thus, an internal electric field is generated in the base layer 5 so that electrons are accelerated from the emitter layer 4 to the collector layer 6.

Figure 3:
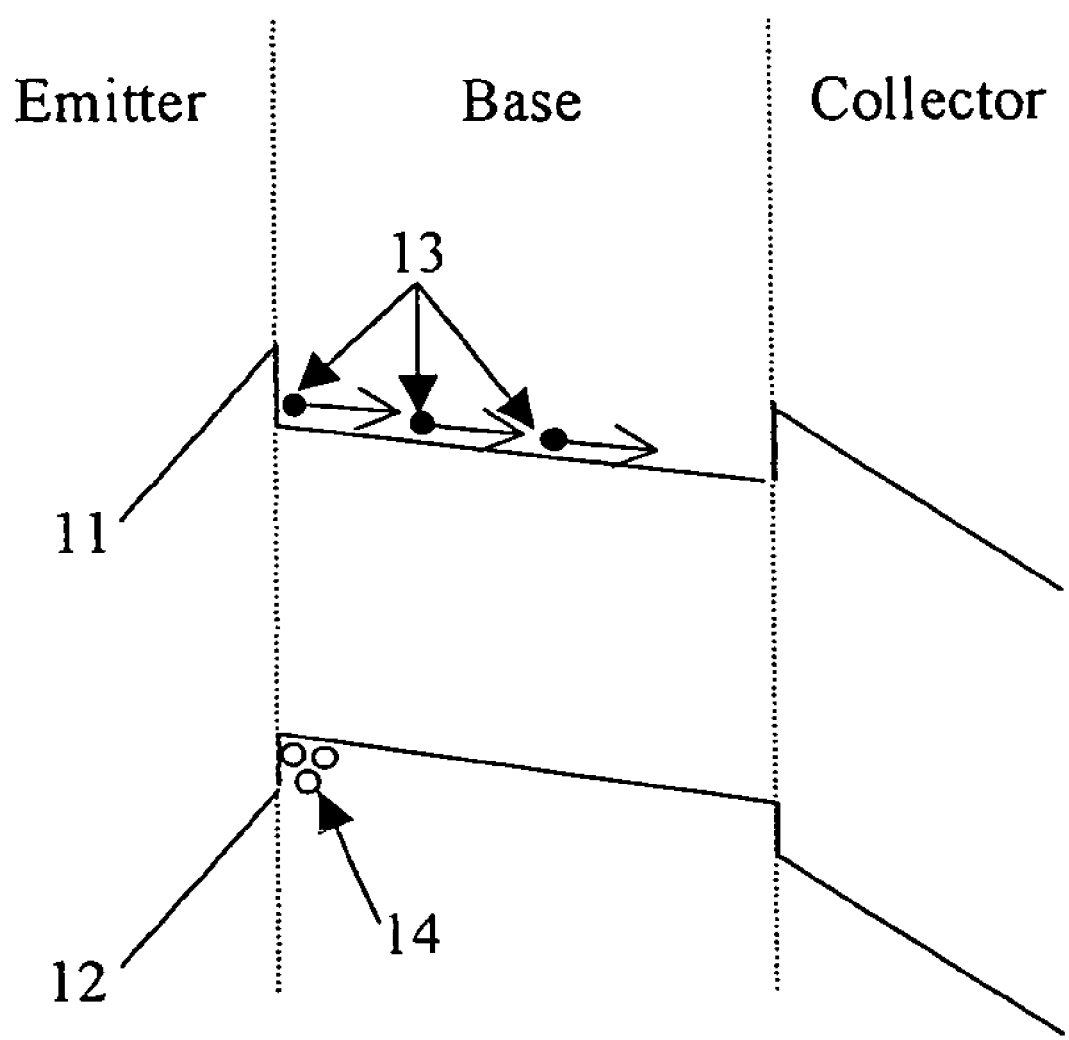
FIG. 3 is a band diagram for the HBT of EMBODIMENT 1 of the present invention.

Accordingly, in the HBT of EMBODIMENT 1, as shown in FIG. 3, the base layer 5 has a band structure in which the band gap is constant in the film thickness direction and the energy of electrons decreases in the direction from the emitter 4 to the collector 6 at an end of a conduction band 11 and an end of a valence band 12.

As has been described, in the HBT of this embodiment, the polarities of the spontaneous polarizations Psp1, Psp2 and Psp3 are the same as the polarities of the piezo polarizations Ppz1, Ppz2 and Ppz3, respectively, so that the spontaneous polarizations Psp1, Psp2 and Psp3 and the piezo polarizations Ppz1, Ppz2 and Ppz3 do not cancel to each other, and the very large electric charge Q12 is generated at the interface of the emitter layer 4 and the base layer 5 while the very large electric charge Q23 is generated at the interface of the base layer 5 and the collector layer 6. Then, with the electric charges Q12 and Q23, in the p-type base layer 5, an internal electric field is generated so that the energy of electrons decreases in the direction from the emitter layer to the collector layer. Accordingly, electrons injected from the emitter layer 4 are accelerated due to the internal electric field from the emitter layer 4 to the collector layer 6 and thus the transit time of electrons traveling in the base layer 5 toward the collector layer can be efficiently and reliably reduced. Therefore, high-frequency characteristics can be improved.

Moreover, the internal electric field is generated due to actions of the spontaneous polarizations Psp1, Psp2 and Psp3 generated in the semiconductor layers 4, 5 and 6, respectively, and of the piezo polarization Ppz1, Ppz2 and Ppz3 generated in the semiconductor layers 4, 5 and 6, respectively. Therefore, there is no need to change the composition ratio of the base layer 5 in the film thickness direction for the purpose of changing the band structure to reduce a resistance in the base layer 5. As a result, it is possible to prevent a method for fabricating a HBT from becoming complicated and also to stably obtain a quality HBT.

Moreover, in EMBODIMENT 1, the junction of the emitter layer 4 and the base layer 5 is a hetero-junction, so that the efficiency of electron injection can be improved.

Moreover, in EMBODIMENT 1, the emitter layer 4 is formed so as to have a higher aluminum composition ratio than that of the collector layer 6. Thus, a barrier at the interface of the base layer 5 and the collector layer 6 is lower than a barrier at the interface of the emitter layer 4 and the base layer 5. Accordingly, when electrons injected from the emitter layer 4 pass through the base layer 5 to reach the collector layer 6, the electrons have enough energy to go over the barrier at the interface of the base layer 5 and the collector layer 6. Therefore, also in this point of view, according to EMBODIMENT 1, the transit time of carriers can be reduced, so that high-frequency characteristics can be improved.

Moreover, in EMBODIMENT 1, the base layer 5 is in contact with the emitter layer 4 at its nitrogen polarity surface while being in contact with the collector layer 6 at its gallium polarity surface. Thus, an internal electric field can be generated in the base layer 5 so that electrons as carries are accelerated in the direction from the emitter layer 4 to the collector layer 6.

Note that for EMBODIMENT 1, a configuration in which at least one of the emitter layer 4 and the collector layer 6 is doped with an impurity at a concentration of $1 \times 10^{18}$ to $1 \times 10^{19}$ cm$^{-3}$ may be used. That is, according to EMBODIMENT 1, in an collector-up structure in which the collector layer 6, the base layer 5 and the emitter layer 4 are stacked in this order from the substrate 1, carriers are hardly injected into the base layer 5 from the emitter layer 4 and also carriers hardly flow into the collector layer 6 from the base layer 5. However, if at least one of the emitter layer 4 and the collector layer 6 is formed of a heavily doped layer containing an impurity at a high concentration, a layer formed of AlGaN becomes a low potential portion and thus carriers can pass through this portion. As a result, if the emitter layer 4 is formed of a heavily doped layer containing an impurity at a high concentration, carriers can be efficiently injected into the base layer 5 from the emitter layer 4. On the other hand, if the collector layer 6 is formed of a heavily doped layer containing an impurity at a high concentration, carriers in the base layer 5 can be made to efficiently flow into the collector layer 6. Therefore, in the collector-up structure, it is very effective to form each of the emitter layer 4 and the collector layer 6 of a heavily doped layer.

Moreover, unlike EMBODIMENT 1, the collector layer 6 may be formed of GaN. In that case, only the junction of the emitter layer 4 and the base layer 5 is a hetero-junction. Also in this case, polarities of spontaneous polarizations are the same as polarities of piezo polarizations, respectively, and thus sufficiently large electric charges are generated in each interface. With the electric charge at each interface, a sufficiently large internal electric field is generated in the base layer 5, so that a transit time of electrons in the base layer 5 can be efficiently and reliably reduced. Furthermore, a barrier is not generated at the interface of the base layer 5 and the collector layer 6. Also in this point, the transit time of carriers can be reduced, so that high-frequency characteristics can be improved.

Second Embodiment

FIG. 4 illustrates EMBODIMENT 2 of the present invention. In this embodiment, each member also described in EMBODIMENT 1 is identified by the same reference numeral and the detailed description thereof will be omitted. In EMBODIMENT 1, a so-called collector-up structure in which the configuration in which the emitter layer 4, the base layer 5 and the collector layer 6 are stacked in this order from the substrate 1 side is formed. In contrast, in EMBODIMENT 2, an emitter-up structure in which the collector layer 6, the base layer 5 and the emitter layer 4 are stacked in this order from the substrate 1 side is formed. Each of the layers is formed by molecular beam epitaxy (MEB).

The GaN buffer layer 3 is formed by MBE. Thus, a surface (upper surface) of the GaN buffer layer 3 at a time when the GaN buffer layer 3 is formed is a nitrogen polarity surface in which nitrogen is located at the outermost side. Moreover, an interface (lower surface) of the GaN buffer layer 3 with the AlN buffer layer 2 is a nitrogen polarity surface in which gallium is located in the outermost side. On the GaN buffer layer 3, the subcollector layer 7 of n-type GaN is formed so as to have a thickness of 500 nm. Si is added as an impurity to GaN forming the subcollector layer 7 at a high concentration ($1 \times 10^{19}$ cm$^{-3}$).

The collector layer 6 is formed on the subcollector layer 7 so as to have a thickness of 500 nm. The collector layer 6 is formed of n-type AlGaN. Si is added as an impurity to AlGaN of the collector layer 6 at a medium concentration ($2 \times 10^{17}$ cm$^{-3}$) and the aluminum composition ratio of the collector layer 6 is 10%.

The base layer 5 is formed on the collector layer 6 so as to have a thickness of 70 nm. The base layer 5 is formed of p-type GaN. Mg is added as an impurity to GaN forming the base layer 5 at a high concentration ($4 \times 10^{19}$ cm$^{-3}$). The impurity concentration is constant in the film thickness direction and thus the base layer 5 has a constant band gap in the film thickness direction.

The emitter layer 4 is formed on the base layer 5. The emitter layer 4 is formed of n-type AlGaN so as to have a thickness of 30 nm. Si is added as an impurity to AlGaN at a medium concentration ($5 \times 10^{17}$ cm$^{-3}$) and the aluminum composition ratio of the emitter layer 4 is 25%.

Figure 4A:
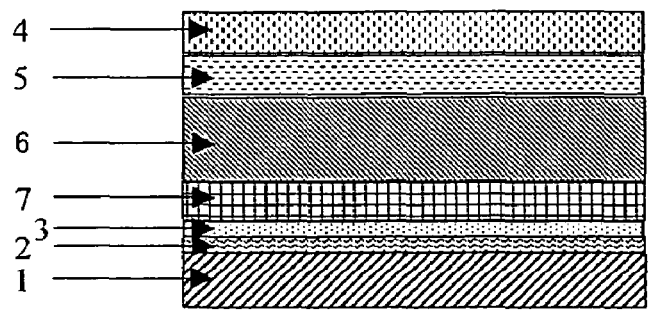
FIG. 4 shows cross-sectional views corresponding to FIG. 1 and illustrating an HBT according to EMBODIMENT 2 of the present invention.
Figure 4B:
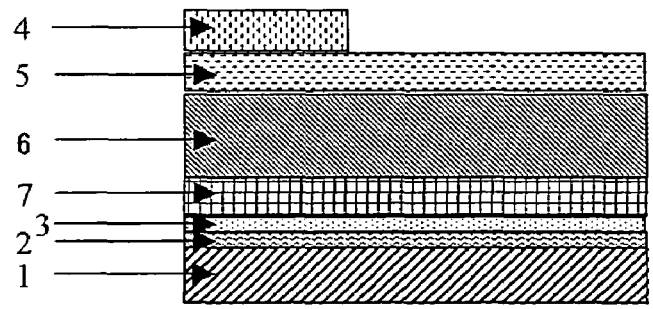
Figure 4C:
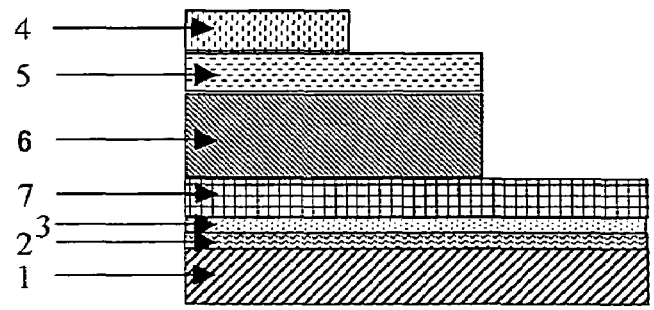
Figure 4D:
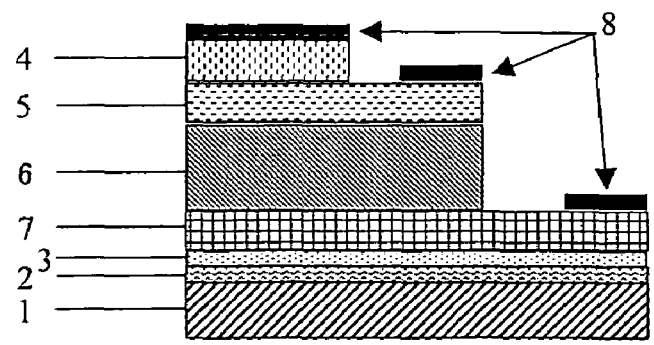
Figure 5A:
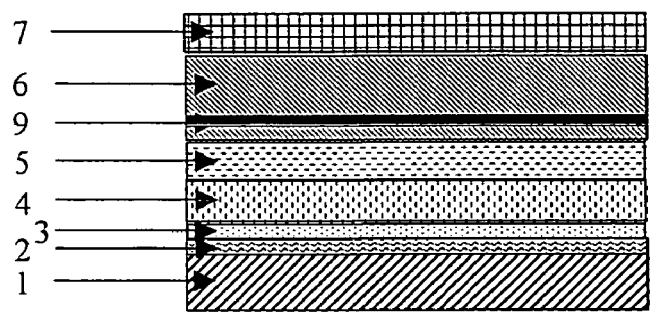
FIG. 5 shows cross-sectional views corresponding to those of FIG. 1 and illustrating an HBT according to EMBODIMENT 3 of the present invention.
Figure 5B:
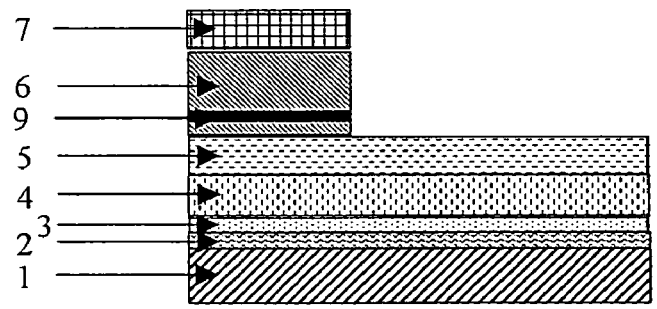
Figure 5C:
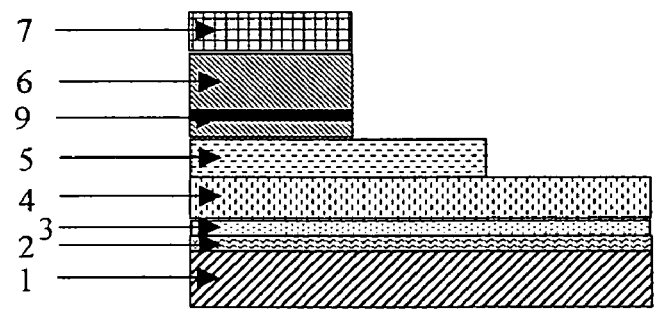
Figure 5D:
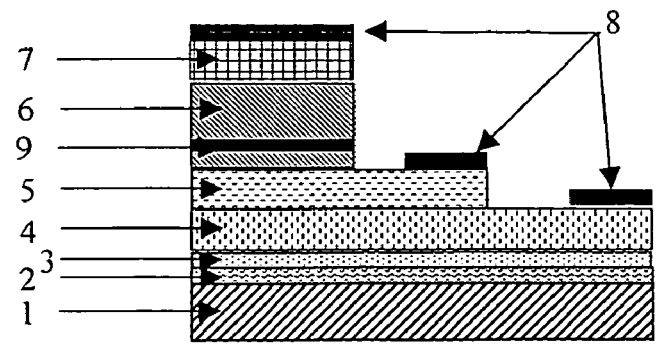

A method for fabricating an HBT of EMBODIMENT 2 will be described. As shown in FIG. 4(a), an AlN buffer layer 2, a GaN buffer layer 3, a subcollector layer 7, a collector layer 6, a base layer 5 and an emitter layer 4 are formed in this order on a sapphire substrate 1. In this case, each of the layers is formed by MBE. Then, as shown in FIG. 4(b), with an Si oxide film as a mask, the emitter layer 4 is etched by dry etching using chloride gas, thereby forming an emitter mesa and having the base layer 5 exposed. Next, as shown in FIG. 4(c), with the Si oxide film as a mask, the base layer 5 and the collector layer 6 are etched by dry etching using chloride gas, thereby having the subcollector layer 7 exposed. Then, as shown in FIG. 4(d), an electrode 8 is formed on each of the emitter layer 4, the base layer 5 and the subcollector layer 7. Thus, the HBT of EMBODIMENT 2 can be formed.

In the HBT of EMBODIMENT 2, the subcollector layer 7 is formed on a nitrogen polarity surface of the GaN buffer layer 3. Thus, the subcollector layer 7 has a lower surface of a gallium polarity surface and an upper layer of a nitrogen polarity surface. Moreover, the collector layer 6 has a lower layer of an aluminum gallium polarity surface and an upper surface of a nitrogen polarity surface and a spontaneous polarization Psp3 is generated. Moreover, in the collector layer 6, a piezo polarization Ppz3 due to crystal strains is generated to have the same polarity as that of the spontaneous polarization Psp3. With the spontaneous polarization Psp3 and the piezo polarization Ppz3 generated, the collector layer 6 has a lower surface of a positive polarity surface and an upper layer of a negative surface.

The base layer 5 is formed on the nitrogen polarity surface of the collector layer 6. Thus, the base layer 5 has a lower surface of a gallium polarity surface and an upper layer of a nitrogen polarity surface and a spontaneous polarization Psp2 is generated. Moreover, in the base layer 5, a piezo polarization Ppz2 due to crystal strains is generated to have the same polarity as that of the spontaneous polarization Psp2. With the spontaneous polarization Psp2 and the piezo polarization Ppz2 generated, the base layer 5 has a lower surface of a positive polarity surface and an upper layer of a negative surface.

The emitter layer 4 is formed on a nitrogen polarity surface of the base layer 5. Thus, the emitter layer 4 has a lower surface of an aluminum gallium polarity surface and an upper layer of a nitrogen polarity surface and a spontaneous polarization Psp1 is generated. Moreover, in the emitter layer 4, a piezo polarization Ppz1 due to crystal strains is generated to have the same polarity as that of the spontaneous polarization Psp1. With the spontaneous polarization Psp1 and the piezo polarization Ppz1 generated, the emitter layer 4 has a lower surface of a positive polarity surface and an upper layer of a negative surface.

The polarities of the spontaneous polarizations Psp2 and Psp3 are the same as the polarities of the piezo polarizations Ppz2 and Ppz3, respectively, so that a very large electric charge Q32 is generated at the interface of the base layer 5 and the collector layer 6. Moreover, the polarities of the spontaneous polarizations Psp1 and Psp2 are the same as the polarities of the piezo polarizations Ppz1 and Ppz2, respectively, so that a very large electric charge Q12 is generated at the interface of the emitter layer 4 and the base layer 5. Thus, an internal electric field is generated in the base layer 5 so that electrons are accelerated in the direction from the emitter layer 4 to the collector layer 6. As has been described, in the HBT of EMBODIMENT 2, the base layer 5 has a band structure in which the band gap is constant in the film thickness direction and the energy of electrons decreases in the direction from the emitter 4 to the collector 6 at each of an end of a conduction band and an end of a valence band.

Therefore, according to EMBODIMENT 2, in the base layer 5, an internal electric field is generated in the direction in which electrons as carriers are accelerated, so that electrons injected from the emitter layer 4 are accelerated by the internal electric field in the direction from the emitter layer 4 to the collector layer 6. Accordingly, the transit time of electrons traveling in the base layer 5 toward the collector layer can be efficiently and reliably reduced. Therefore, high-frequency characteristics can be improved. Then, in the HBT, holes are stored in part of the base layer 5 located around the interface with the emitter layer 4, i.e., in the vicinity of the base electrode 8, due to the internal electric field, so that a base resistance can be reduced.

Moreover, in EMBODIMENT 2, the base layer 5 is in contact with the emitter layer 4 at its nitrogen polarity surface while being in contact with the collector layer 6 at its gallium polarity surface. Thus, an internal electric field can be generated in the base layer 5 so that electrons as carries are accelerated in the direction from the emitter layer 4 to the collector layer 6. Therefore, high-frequency characteristics can be improved.

Note that for EMBODIMENT 2, a configuration in which at least one of the emitter layer 4 and the collector layer 6 is doped with an impurity at a (high) concentration of $1 \times 10^{18}$ to $1 \times 10^{19}$ cm$^{-3}$ may be used. In that case, if the emitter layer 4 is formed of a heavily doped layer containing an impurity at a high concentration, carriers can be efficiently injected into the base layer 5 from the emitter layer 4. On the other hand, if the collector layer 6 is formed of a heavily doped layer containing an impurity at a high concentration, carriers in the base layer 5 can be made to efficiently flow into the collector layer 6.

Moreover, unlike EMBODIMENT 2, the collector layer 6 may be formed of GaN. In that case, only the junction of the emitter layer 4 and the base layer 5 is a hetero-junction. However, in this case, the polarities of the spontaneous polarizations are the same as the polarities of the piezo polarizations, so that a sufficiently large electric charge is generated in each interface. With the electric charge in each interface, a sufficiently large internal electric field is generated in the base layer 5, so that the transit time of electrons in the base layer 5 can be efficiently and reliably reduced. Furthermore, a barrier is not generated at the interface of the base layer 5 and the collector layer 6. Also in this point, the transit time of carriers can be reduced, so that high-frequency characteristics can be improved.

The structure, operation and effect of other part are the same as those in EMBODIMENT 1.

Third Embodiment

FIG. 5 illustrates EMBODIMENT 3 of the present invention. In this embodiment, each member also described in EMBODIMENT 1 is identified by the same reference numeral and therefore the detailed description thereof will be omitted. In EMBODIMENT 3, a collector-up structure is formed and a heavily doped layer 9 is provided in the collector layer 6.

The heavily doped layer 9 is formed by δ doping. That is, only monosilane (SiH4) is introduced into a furnace when the collector layer 6 has been formed to have a thickness of 20 nm or less, and more preferably a thickness of 10 nm or less, i.e., for example, a thickness of 3 nm, thereby forming the heavily doped layer 9 doped with Si at a high concentration ($5 \times 10^{12}$ cm$^{-2}$). Thereafter, the collector layer 6 is formed again so that the thickness the collector layer 6 becomes 500 nm. Thus, in the collector layer 6, the heavily doped layer 9 doped with an impurity at a high concentration is provided only in part of the collector layer 6 in the film thickness direction. A method for forming other part is the same as that of EMBODIMENT 1.

Thus, in EMBODIMENT 3, a low potential portion is formed in the collector layer 6 of AlGaN, so that carriers can pass through the part and carriers which have passed through the base layer 5 can be made to efficiently flow into the collector layer 6. Moreover, the heavily doped layer 9 is formed by δ doping, so that the heavily doped layer 9 is formed in part of the collector layer. As a result, a distortion generated at the interface of AlGaN and GaN is not eased and the low potential portion can be formed in the collector layer 6. Thus, even with the heavily doped layer 9 provided, the intensity of an internal electric field generated in the base layer 5 is not reduced. Accordingly, the efficiency of carrier injection can be improved and thus the transit time of carriers can be reduced. Therefore, high-frequency characteristics can be improved.

Moreover, in EMBODIMENT 3, the heavily doped layer 9 is provided in the collector layer 6 so as to be located at a distance of 20 nm or less from the interface with the base layer 5. Thus, injection of electrons into the collector layer 6 from the base layer 5 can be efficiently performed. Accordingly, the transit time of carriers can be reduced, so that high-frequency characteristics can be improved.

Note that in EMBODIMENT 3, the heavily doped layer 9 is formed in the collector layer 6. Instead of this, a heavily doped layer may be formed in the emitter layer 4 or a heavily doped layer may be formed in each of the emitter layer 4 and the collector layer 6. In a structure in which a heavily doped layer is formed in the emitter layer 4, the heavily doped layer is preferably provided in the emitter layer so as to be located at a distance of 20 nm or less, and more preferably 10 nm or less, from the interface with the base layer 5. Thus, electron injection into the emitter layer 4 from the electrode 8 provided on the upper surface of the emitter layer 4 can be efficiently performed. On the other hand, the same emitter-up structure as that of EMBODIMENT 2 may be formed and also a heavily doped layer may be formed in the emitter layer 4. In that case, the electrode 8 is formed on a surface (upper surface) of the emitter layer 4 located in the opposite side to the interface with the base layer 5. Therefore, it is preferable to form a heavily doped layer in the emitter layer 4 so as to be located at a distance of 20 nm or less, and more preferably 10 nm or less, from the upper surface of the base layer 5. Thus, electron injection into the emitter layer 4 from the electrode 8 can be efficiently performed. Moreover, a structure in which a heavily doped layer is provided in the collector layer 6 in the emitter-up structure may be formed. In that case, a heavily doped layer is preferably formed in the collector layer 6 so as to be located at a distance of 20 nm or less, and more preferably 10 nm or less, from the interface with the base layer 5. Thus, electron injection into the collector layer 6 from the base layer 5 can be efficiently performed.

The structure, operation and effect of other part are the same as those in EMBODIMENT 1.

Embodiment 4

FIG. 6 illustrates EMBODIMENT 4 of the present invention. In this embodiment, each member also described in EMBODIMENT 1 is identified by the same reference numeral and therefore the detailed description thereof will be omitted. In EMBODIMENT 4, the semiconductor layers 4, 5 and 6 are stacked to form a collector-up structure. Each of the layers is formed by MOCVD.

Figure 6A:
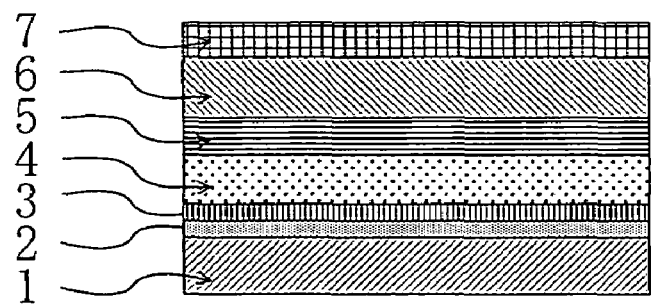
FIG. 6 shows cross-sectional views corresponding to those of FIG. 1 and illustrating an HBT according to EMBODIMENT 4 of the present invention.
Figure 6B:
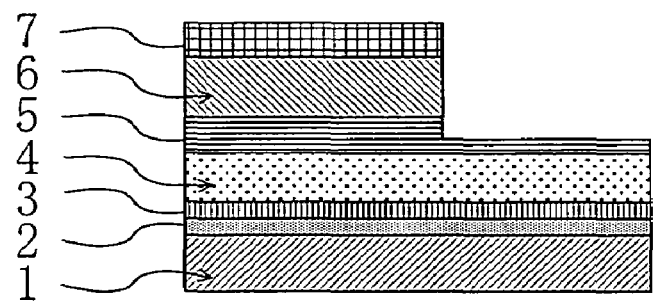
Figure 6C:
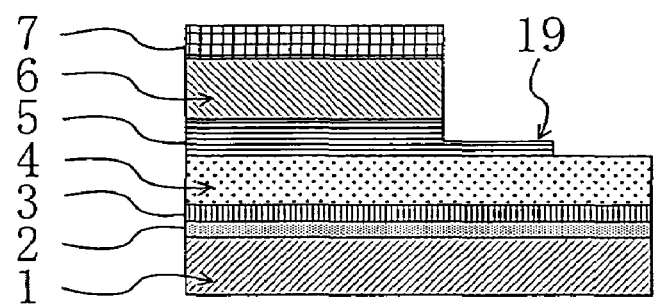
Figure 6D:
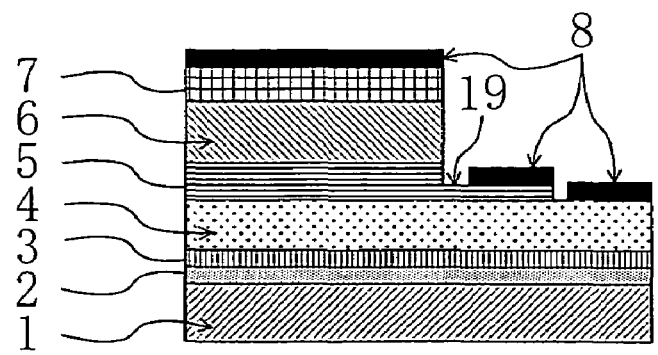

In EMBODIMENT 4, a thin layer portion 19 is formed in the base layer 5 so as to have a smaller thickness than that of other part of the base layer 5. The thin layer portion 19 is formed, as shown in FIG. 6(c), by performing etching so as to leave a 10 nm thickness of the base layer 5 when the base layer 5 is etched by dry etching. Thus, in the base layer 5 of GaN, the interface with the emitter layer 4 of AlGaN is left in the thin layer portion 19. Then, the base electrode 8 is formed on an upper surface of the thin layer portion 19. A method for forming other part is the same as that of EMBODIMENT 1.

Therefore, in EMBODIMENT 4, the interface of the emitter layer 4 and the thin layer portion 19 of the base layer 5 is a hetero-junction interface and the emitter layer 4 and the thin layer portion 19 have different bands. Moreover, in the base layer 5, an internal electric field is generated in the direction from the collector layer 6 to the emitter layer 4. Accordingly, electrons are accelerated in the direction from the emitter layer 4 and the collector layer 6 due to the internal electric field. Thus, the transit time of carriers can be reduced, so that high-frequency characteristics can be improved. Moreover, holes are stored in part of the base layer located in the vicinity of the interface with the emitter layer 4 due to the internal electric field, so that holes are stored in the vicinity of the base electrode 8 in contact with the base layer 5. Thus, a resistance in the base layer 5 can be reduced.

The structure, operation and effect of other part are the same as those in EMBODIMENT 1.

Embodiment 5

FIG. 7 illustrates EMBODIMENT 5 of the present invention. In this EMBODIMENT, each member also described in EMBODIMENT 4 is identified by the same reference numeral and therefore the detailed description thereof will be omitted. In EMBODIMENT 5, an emitter contact layer 10 of n-type AlGaN is formed on the GaN buffer layer 3 and the emitter layer 4 of AlGaN is formed on the emitter contact layer 10. The emitter contact layer 10 is formed of n-type GaN to have a thickness of 30 nm and Si is added to GaN at a high concentration ($5 \times 10^{19}$ cm$^{-3}$).

Figure 7A:
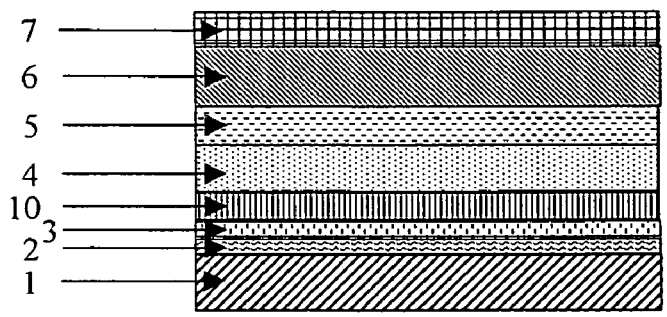
FIG. 7 shows cross-sectional views corresponding to those of FIG. 1 and illustrating an HBT according to EMBODIMENT 5 of the present invention.
Figure 7B:
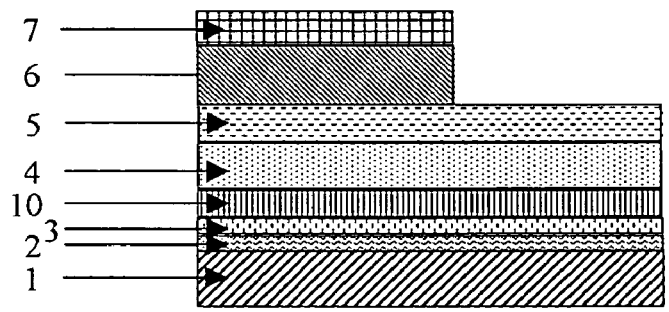
Figure 7C:
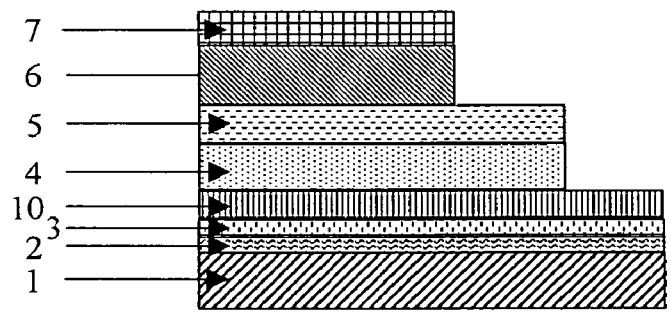
Figure 7D:
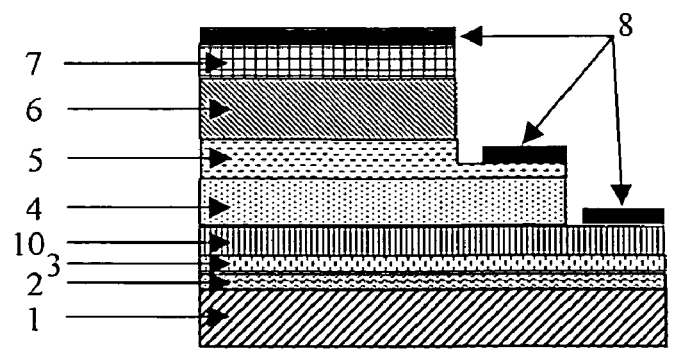

In the emitter layer 4, part of the emitter layer 4 is shaved so that the emitter contact layer 10 is exposed therethrough. Then, the emitter electrode 8 is directly in contact with the emitter contact layer 10. That is, as shown in FIG. 7(c), the emitter contact layer 10 is made to be exposed when the base layer 5 and the emitter layer 4 are etched by dry etching. The emitter electrode 8 is formed on an upper surface of the emitter contact layer 10. Thus, the emitter layer 4 and the emitter electrode 8 for injecting electrons into the emitter layer 4 form an ohmic contact with the emitter contact layer 10 of n-type GaN interposed therebetween. A method for forming other part is the same as that of each of EMBODIMENT 1 and EMBODIMENT 4.

Therefore, in EMBODIMENT 5, the emitter contact layer 10 of GaN is in contact with the emitter layer 4 of AlGaN and the emitter electrode 8 is in contact with the emitter contact layer 10. Since GaN has a smaller band gap than that of AlGaN, an ohmic contact can be easily formed, so that a low resistance ohmic contact can be formed. Therefore, high-frequency characteristics can be improved.

The structure, operation and effect of other part are the same as those in EMBODIMENT 1.

Embodiment 6

FIG. 8 illustrates EMBODIMENT 6 of the present invention. In this embodiment, each member also described in EMBODIMENT 1 is identified by the same reference numeral and therefore the detailed description thereof will be omitted. In EMBODIMENT 6, the emitter contact layer 10 of n-type GaN is provided on the GaN buffer layer 3 and the emitter layer 4 of AlGaN is formed on the emitter contact layer 10.

The emitter contact layer 10 is formed of n-type GaN to have a thickness of 30 nm and Si is added to GaN at a high concentration ($5 \times 10^{19}$ cm$^{-3}$).

Figure 8A:
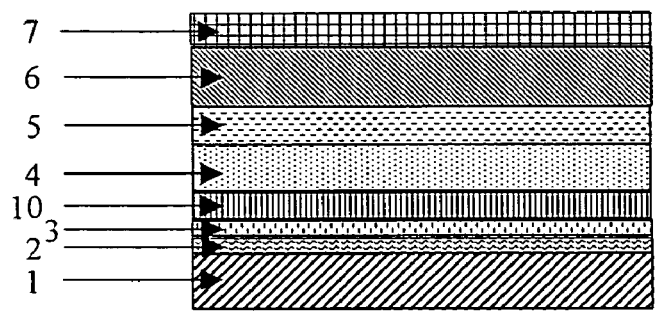
FIG. 8 shows cross-sectional views corresponding to those of FIG. 1 and illustrating an HBT according to EMBODIMENT 6 of the present invention.
Figure 8B:
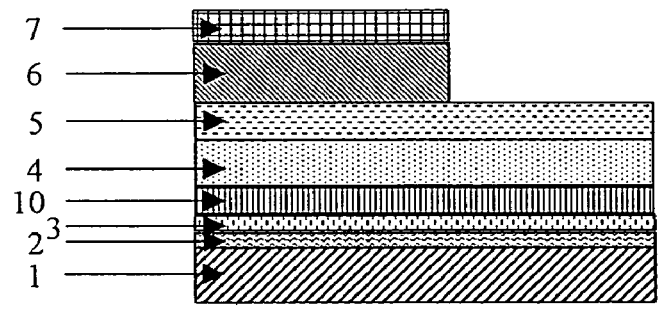
Figure 8C:
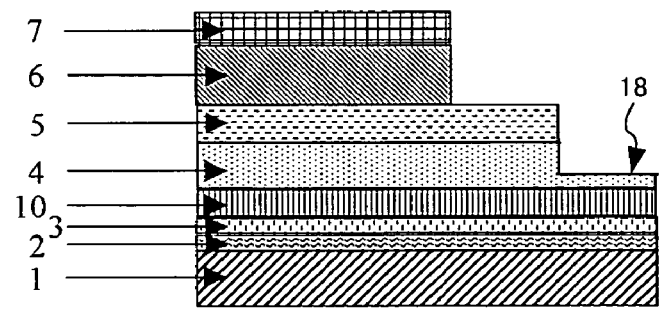
Figure 8D:
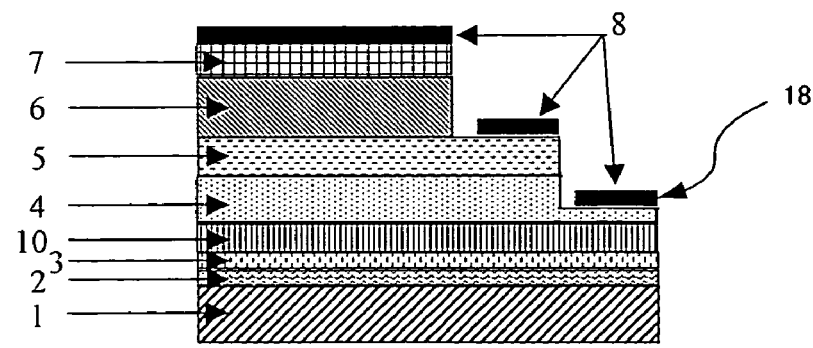
Figure 9:
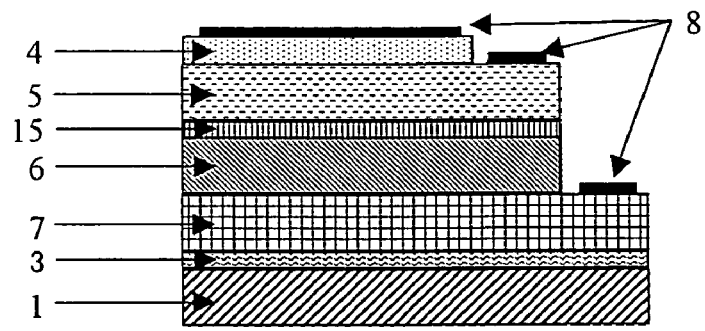
FIG. 9 shows cross-sectional views corresponding to those of FIG. 1 and illustrating a known HBT.
Figure 10:
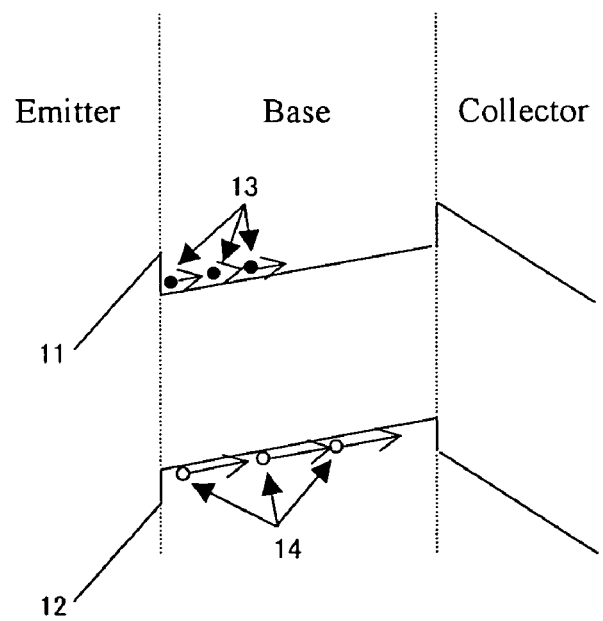
FIG. 10 shows a band diagram corresponding to that of FIG. 3 and illustrating a known HBT.

In the emitter layer 4, a thin layer portion 18 is formed so as to have a smaller thickness than that of other part of the emitter layer 4. The thin layer portion 18 is formed, as shown in FIG. 8(c), by performing etching so as to leave a thickness of 10 nm of the emitter layer 4 when the emitter layer 4 is etched by dry etching. Thus, in the emitter layer 4, the interface with the emitter contact layer 10 is left in the thin layer portion 18. Then, the base electrode 8 is formed on an upper surface of the thin layer portion 18. A method for forming other part is the same as that of EMBODIMENT 1.

Therefore, in EMBODIMENT 6, the interface of the emitter layer 4 of AlGaN and the emitter contact layer 10 of GaN is a hetero-junction interface, and because of differences in polarity characteristics between AlGaN and GaN, conduction electrons (two-dimensional conduction electron gas) are stored in the emitter contact layer 10 side at the interface of the thin layer portion of the emitter layer 4 and the emitter contact layer 10. Thus, the conduction electrons can be used for forming an ohmic contact with the emitter electrode 8 and a low resistance ohmic contact can be formed. Therefore, high-frequency characteristics can be improved.

Moreover, according to EMBODIMENT 6, in the base layer 5, an internal electric field is also generated in the direction in which electrons are accelerated. Therefore, the transit time of carriers can be reduced, so that high-frequency characteristics can be improved.

The structure, operation and effect of other part are the same as those in EMBODIMENT 1.

What is claimed is:

1. A semiconductor device comprising:
    an n-type first semiconductor layer formed so that electrons are externally injected into the first semiconductor layer;
    a p-type second semiconductor layer formed so that electrons injected into the first semiconductor layer are injected into the second semiconductor layer; and
    an n-type third semiconductor layer formed so that electrons having passed through the second semiconductor layer flow into the third semiconductor layer,
    the first, second and third semiconductor layers being in contact with one another in this order,
    wherein spontaneous polarizations Psp1, Psp2 and Psp3 are generated in the first, second and third semiconductor layers, respectively,
    wherein the second semiconductor layer is formed so as to have a configuration in which an internal electric field is generated so that an energy of electrons decreases in the direction from the first semiconductor layer to the third semiconductor layer due to an electric charge Q12 generated at an interface with the first semiconductor layer by an interaction of the spontaneous polarizations Psp1 and Psp2 and an electric charge Q23 generated at an interface with the third semiconductor layer by an interaction of the spontaneous polarizations Psp2 and Psp3,
    wherein each of the first and third semiconductor layers is formed of aluminum gallium nitride, and
    wherein the second semiconductor layer is formed of gallium nitride,
    wherein in the first semiconductor layer, while a contact layer of n-type gallium nitride is in contact with a surface of the first semiconductor layer located on an opposite side to the second semiconductor layer, a thin layer portion is formed, with an interface with the contact layer, so as to have a smaller thickness than that of other part, and
    wherein an electrode for injecting electrons is in contact with the thin layer portion.

* * * * *